(12) United States Patent
Matsuki et al.

(10) Patent No.: US 8,084,277 B2
(45) Date of Patent: Dec. 27, 2011

(54) SEMICONDUCTOR DEVICE AND MANUFACTURING METHOD THEREOF

(75) Inventors: Hirohisa Matsuki, Kawasaki (JP); Jun Fukuda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 153 days.

(21) Appl. No.: 12/453,715

(22) Filed: May 20, 2009

(65) Prior Publication Data
US 2009/0230560 A1    Sep. 17, 2009

Related U.S. Application Data

(62) Division of application No. 11/529,376, filed on Sep. 29, 2006, now Pat. No. 7,550,844.

(30) Foreign Application Priority Data

Mar. 31, 2006    (JP) .................................. 2006-096633

(51) Int. Cl.
*H01L 21/00*    (2006.01)
(52) U.S. Cl. .............................. 438/14; 438/15; 438/612
(58) Field of Classification Search .............. 438/14–15, 438/612
See application file for complete search history.

(56) References Cited

U.S. PATENT DOCUMENTS

| 5,196,726 | A | | 3/1993 | Nishiguchi et al. |
| 5,903,058 | A | | 5/1999 | Akram |
| 5,920,117 | A | * | 7/1999 | Sono et al. .................... 257/675 |
| 6,172,422 | B1 | | 1/2001 | Chigawa et al. |
| 6,251,694 | B1 | * | 6/2001 | Liu et al. .......................... 438/14 |
| 6,297,561 | B1 | * | 10/2001 | Liu et al. ....................... 257/779 |
| 6,303,880 | B1 | | 10/2001 | Asai et al. |
| 6,455,408 | B1 | | 9/2002 | Hwang et al. |
| 6,472,729 | B1 | | 10/2002 | Oka |
| 6,496,023 | B1 | * | 12/2002 | Kanamaru et al. ....... 324/755.07 |
| 6,509,643 | B2 | | 1/2003 | Ohtaka et al. |
| 6,566,239 | B2 | | 5/2003 | Makino et al. |

(Continued)

FOREIGN PATENT DOCUMENTS

JP    04152634 A   *   5/1992
(Continued)

OTHER PUBLICATIONS

Japanese Office Action dated Sep. 13, 2011, issued in corresponding Japanese Patent Application No. 2006-096633, with partial translation.

*Primary Examiner* — Laura Menz
(74) *Attorney, Agent, or Firm* — Westerman, Hattori, Daniels & Adrian, LLP

(57) ABSTRACT

A semiconductor device and manufacturing method thereof improving moisture resistance of a FeRAM. After a probe test using a pad, a metal film is formed to cover the pad in an opening of a protective film and a region from the pad to an opening outer periphery of the protective film. On the metal film, a metal bump is formed. The metal film is formed to have a two-layer structure of the first and second metal films. Materials of the lower and upper layers are selected mainly in consideration of adhesion to the protective film and adhesion to the metal bump, respectively. Film formation conditions thereof are set to provide metal films with a desired quality and thickness. Thus, penetration of moisture from the pad or the periphery into a ferroelectric capacitor can be prevented and therefore, occurrence of potential inversion abnormalities due to penetrated moisture can be effectively suppressed.

6 Claims, 14 Drawing Sheets

U.S. PATENT DOCUMENTS

| | | | |
|---|---|---|---|
| 6,579,734 B2 * | 6/2003 | Aoki | 438/15 |
| 6,633,176 B2 * | 10/2003 | Takemoto et al. | 324/755.01 |
| 6,774,654 B2 * | 8/2004 | Kanamaru et al. | 324/754.11 |
| 7,095,045 B2 | 8/2006 | Chiba et al. | |
| 7,274,195 B2 * | 9/2007 | Takemoto et al. | 324/754.07 |
| 7,276,923 B2 * | 10/2007 | Takemoto et al. | 324/755.01 |
| 7,279,706 B2 * | 10/2007 | Kobayashi | 257/48 |
| 7,524,684 B2 * | 4/2009 | Kobayashi | 438/15 |
| 7,550,844 B2 * | 6/2009 | Matsuki et al. | 257/737 |
| 7,626,406 B2 * | 12/2009 | Ishii | 324/750.24 |
| 7,712,177 B2 * | 5/2010 | Yoshida et al. | 15/210.1 |
| 2001/0046715 A1 * | 11/2001 | Takemoto et al. | 438/2 |
| 2002/0017716 A1 | 2/2002 | Ohtaka et al. | |
| 2002/0076909 A1 | 6/2002 | Matsuki et al. | |
| 2004/0245621 A1 | 12/2004 | Hanaoka et al. | |
| 2005/0073056 A1 * | 4/2005 | Kobayashi | 257/780 |
| 2005/0186771 A1 | 8/2005 | Tanida et al. | |
| 2005/0224970 A1 | 10/2005 | Matsuki et al. | |
| 2006/0038575 A1 * | 2/2006 | Takemoto et al. | 324/754 |
| 2006/0076679 A1 | 4/2006 | Batchelor et al. | |
| 2007/0015351 A1 | 1/2007 | Tomimori et al. | |
| 2007/0228561 A1 * | 10/2007 | Matsuki et al. | 257/737 |
| 2008/0009083 A1 * | 1/2008 | Kobayashi | 438/17 |
| 2008/0090315 A1 * | 4/2008 | Abe et al. | 438/31 |
| 2008/0241977 A1 * | 10/2008 | Kobayashi | 438/18 |
| 2008/0258260 A1 * | 10/2008 | Nagai et al. | 257/532 |
| 2009/0230560 A1 * | 9/2009 | Matsuki et al. | 257/773 |
| 2011/0019709 A1 * | 1/2011 | Masui et al. | 372/46.01 |

FOREIGN PATENT DOCUMENTS

| | | |
|---|---|---|
| JP | 06045392 A * | 2/1994 |
| JP | 2005-268617 A | 9/2005 |
| WO | 2004-001839 A1 | 12/2003 |

* cited by examiner

SEMICONDUCTOR DEVICE AND MANUFACTURING METHOD THEREOF

CROSS-REFERENCE TO RELATED APPLICATIONS

This application is a division of U.S. application Ser. No. 11/529,376, filed on Sep. 29, 2006 which is based upon and claims the benefits of priority from the prior Japanese Patent Application No. 2006-096633, filed on Mar. 31, 2006, the entire contents of which are incorporated herein by reference.

BACKGROUND OF THE INVENTION

1. Field of the Invention

The present invention relates to a semiconductor device and a method for manufacturing the semiconductor device. More particularly, the present invention relates to a semiconductor device having a ferroelectric capacitor and a method for manufacturing the semiconductor device.

2. Description of the Related Art

A Ferro-electric Random Access Memory (FeRAM) element using a ferroelectric capacitive element (ferroelectric capacitor) as a storage capacitive element is a non-volatile memory device having the following characteristics. That is, a high-speed operation is enabled, power consumption is low and, writing and readout durability is excellent.

In a manufacturing process of such a FeRAM element, a continuity test or a potential inversion test of the ferroelectric substance is generally performed to inspect the presence of abnormalities.

On the other hand, the ferroelectric capacitor has a property of easily deteriorating due to moisture or hydrogen (referred to as "moisture") which penetrates from the outside.

Therefore, there is proposed a structure that a ferroelectric capacitor is covered with an aluminum oxide film to block moisture from reaching the ferroelectric capacitor in a formation step of the FeRAM element and after formation thereof (See, e.g., Japanese Unexamined Patent Publication No. 2005-268617).

In a continuity test or a potential inversion test of the ferroelectric capacitor in a manufacturing process of a FeRAM element, there is generally used an external connection electrode pad to which a metal wire or a metal bump is finally connected. Further, a predetermined probe is brought into contact with the electrode pad to perform a predetermined test such as the potential inversion test of the ferroelectric capacitor.

However, when a probe test is thus performed, mechanical injuries may occur in an electrode pad due to contact with a probe. Further, after the probe test, a metal wire is connected also to the electrode pad with injuries in the same manner as in an electrode pad with no injury.

FIG. 14 schematically shows a state where in a FeRAM element, a metal wire is connected to an electrode pad after a probe test.

In FIG. 14, a FeRAM element 200 has a structure that a ferroelectric capacitor 203 comprising a layered product including a lower electrode 203a, a ferroelectric film 203b and an upper electrode 203c is formed within an interlayer insulating film 202 formed over a semiconductor substrate 201.

An active element such as a transistor and passive element such as a capacitive element formed over the semiconductor substrate 201 as well as other wiring layers provided within the interlayer insulating film 202 are not shown in the figure.

The ferroelectric capacitor 203 is electrically connected to a transistor (not shown) formed using the semiconductor substrate 201 as well as electrically connected to an electrode pad 205 through a connection via 204 connected to the upper electrode 203c of the capacitor 203. The electrode pad 205 has a state of being partially exposed from an opening provided in a protective film 206 formed over the pad 205.

A probe test on the FeRAM element 200 is performed using such an electrode pad 205.

More specifically, a probe is brought into contact with the electrode pad 205 to inspect overall continuity as well as potential inversion of the ferroelectric capacitor 203. In such a probe test, since the probe is brought into contact with the electrode pad 205, a concave portion 207a and/or a convex portion 207b are formed on the pad 205 as shown in the figure.

Further, after the probe test, a metal wire 208 for connecting to an external substrate is connected to the electrode pad 205.

However, when the concave portion 207a and/or the convex portion 207b are formed on the electrode pad 205, the concave portion 207a may be partially exposed or a gap may occur between the metal wire 208 and the electrode pad 205 in connecting the metal wire 208 to the pad 205.

In the case where the concave portion 207a is formed to penetrate through the electrode pad 205 into the interlayer insulating film 202, moisture penetrates within the interlayer insulating film 202 through the concave portion 207a of which the whole or a part is exposed, or through the gap between the metal wire 208 and the electrode pad 205.

Further, when the penetrated moisture reaches the ferroelectric capacitor 203, the possibility is increased that an abnormality occurs in the potential inversion of the capacitor 203, and as a result, the FeRAM element 200 is in danger of malfunctioning.

Herein, description is made by taking as an example a case of using the FeRAM element. Further, the problem caused by such penetration of moisture from the outside may similarly occur as long as the semiconductor device having an electrode pad is used. For example, there is a problem that migration of wiring materials easily occurs due to moisture which penetrates into the inside through an injured electrode pad.

SUMMARY OF THE INVENTION

In view of the foregoing, it is an object of the present invention to provide a semiconductor device having high moisture resistance and high reliability. Another object of the present invention is to provide a method for manufacturing the semiconductor device.

To accomplish the above objects, according to one aspect of the present invention, there is provided a semiconductor device comprising: semiconductor substrate; an electrode pad provided over the semiconductor substrate through an insulating film, the pad having a mechanical injury; a conductive film for covering the electrode pad; and an external connection terminal connected to the conductive film.

According to another aspect of the present invention, there is provided a method for manufacturing a semiconductor device, comprising the steps of: forming an electrode pad over a semiconductor substrate; bringing a probe into contact with the electrode pad; covering the electrode pad to form a conductive film; and connecting an external connection terminal to the conductive film.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

By taking as an example a FeRAM element, preferred embodiments of the present invention will be described in detail below with reference to the accompanying drawings.

A first embodiment will be first described.

Figure 1:
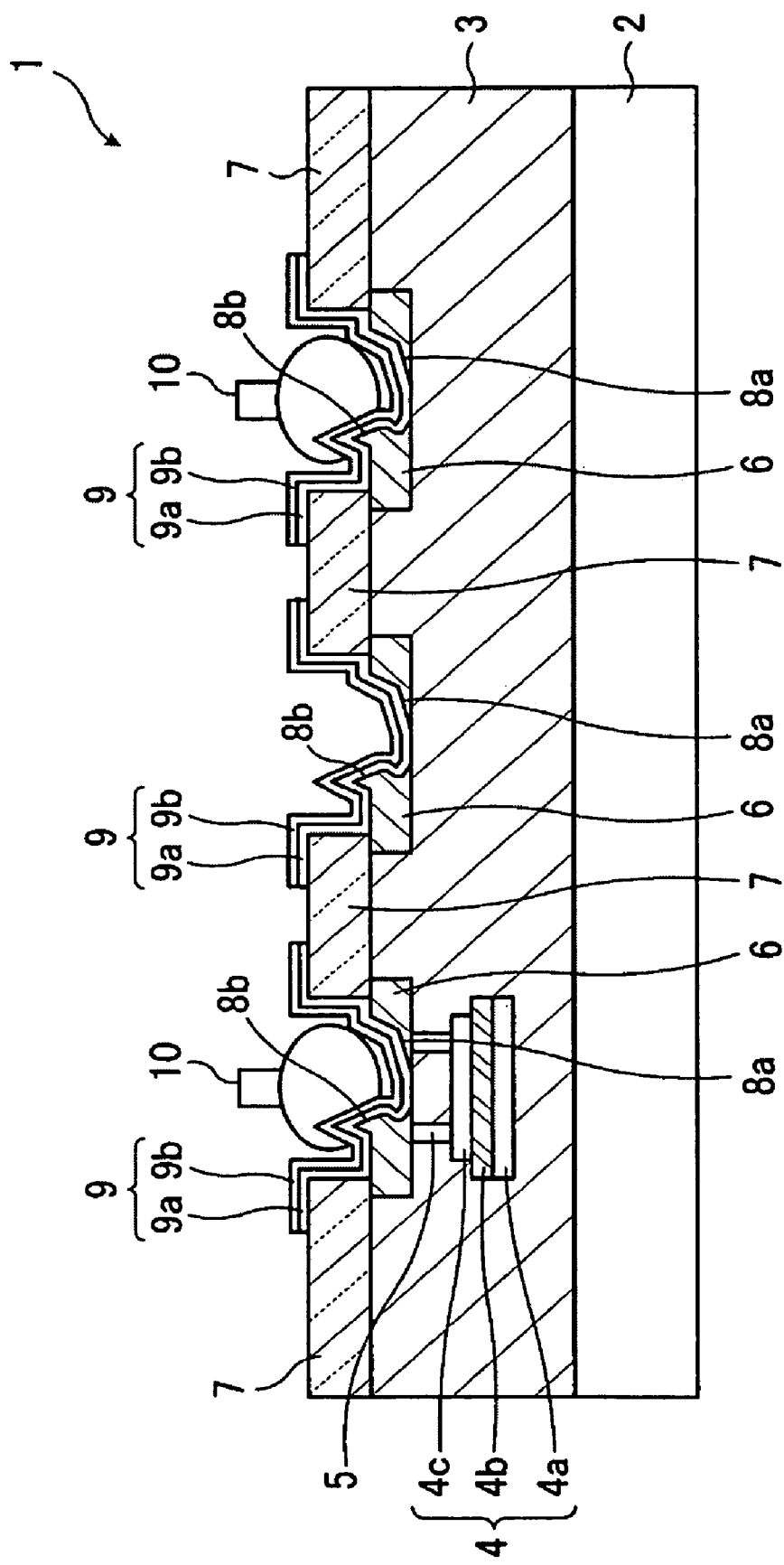
FIG. 1 is a schematic sectional view showing an essential part of a FeRAM element according to a first embodiment.

FIG. 1 is a schematic sectional view showing an essential part of a FeRAM element according to the first embodiment of the present invention.

A FeRAM element 1 shown in FIG. 1 has a ferroelectric capacitor 4 comprising a layered product including a lower electrode 4a made of platinum (Pt), a ferroelectric film 4b made of lead zirconate titanate (PZT), and an upper electrode 4c made of iridium oxide ($IrO_2$) within an interlayer insulating film 3 made of oxide silicon ($SiO_2$) formed over a semiconductor substrate 2.

In the FeRAM element 1, the ferroelectric capacitor 4 is electrically connected to a transistor (not shown) formed using the semiconductor substrate 2. To the element 1, a so-called stacked capacitor structure as described below is applied. That is, immediately above a conductive plug connected to the transistor, the ferroelectric capacitor 4 is provided to directly connect the conductive plug to the lower electrode 4a.

The ferroelectric capacitor 4 is electrically connected to an electrode pad 6 made of aluminum (Al) through a connection via 5 connected to the upper electrode 4c. The electrode pad 6 is selectively exposed within an opening provided in an insulating protective film 7 made of silicon nitride (SiN) formed over the pad 6.

An active element such as a transistor and passive element such as a capacitive element formed over the semiconductor substrate 2 as well as other wiring layers provided within the interlayer insulating film 3 are not shown in the figure.

When a probe test is performed in this state, the probe is brought into contact with the electrode pad 6, and as a result, a mechanical injury such as a concave portion 8a and/or a convex portion 8b occurs in the electrode pad 6.

In the first embodiment, in a step between the probe test and the formation of external connection terminals such as metal wires or metal bumps, a surface of the electrode pad 6 and a region of an opening outer periphery of a protective film 7 around the pad 6 are covered with a metal film 9 having a two-layer structure composed of first and second metal films 9a and 9b.

Further, on the electrode pad 6 having formed thereon the metal film 9, a metal bump 10 used for connection to an external substrate is formed.

The metal bump 10 can be formed, for example, using gold (Au), palladium (Pd), copper (Cu), tin (Sn), nickel (Ni) and aluminum (Al). Further, the metal bump 10 can be formed, for example, using an alloy containing lead (Pb), tin (Sn) and indium (In).

Herein, there can be adopted a structure where on the metal film 9, a metal wire formed using gold (Au), palladium (Pd) and copper (Cu) is connected in place of the metal bump 10.

When the metal film 9 for covering the surface of the electrode pad 6 and the region from the pad 6 to the opening outer periphery of the protective film 7 is formed to have a two-layer structure, a material for the first lower metal film 9a is selected particularly in consideration of its electrical conductivity and adhesion to the protective film 7. Examples of the metals having superior electrical conductivity and adhesion to the protective film 7 include titanium (Ti), chromium (Cr) and molybdenum (Mo).

On the other hand, a material for the second upper metal film 9b is selected particularly in consideration of its electrical conductivity and adhesion to the metal bump 10. Examples of the metals having superior electrical conductivity and adhesion to the metal bump 10 include Pd, Cu, Ni and Au.

By thus covering with the metal film 9 the surface of the electrode pad 6 and the region from the pad 6 to the opening outer periphery of the protective film 7, even when the concave portion 8a and/or the convex portion 8b are formed in the electrode pad 6 after the probe test, penetration of moisture from such portions can be prevented by the metal film 9. Further, even when voids occur between the metal bump 10 and the electrode pad 6 after the formation of the metal bump 10, penetration of moisture from such portions can be prevented by the metal film 9.

Subsequently, one example of a formation flow of the FeRAM element 1 having the above-described structure will be described. Herein, the formation flow after formation of the metal film 9 will be mainly described.

Figure 2:
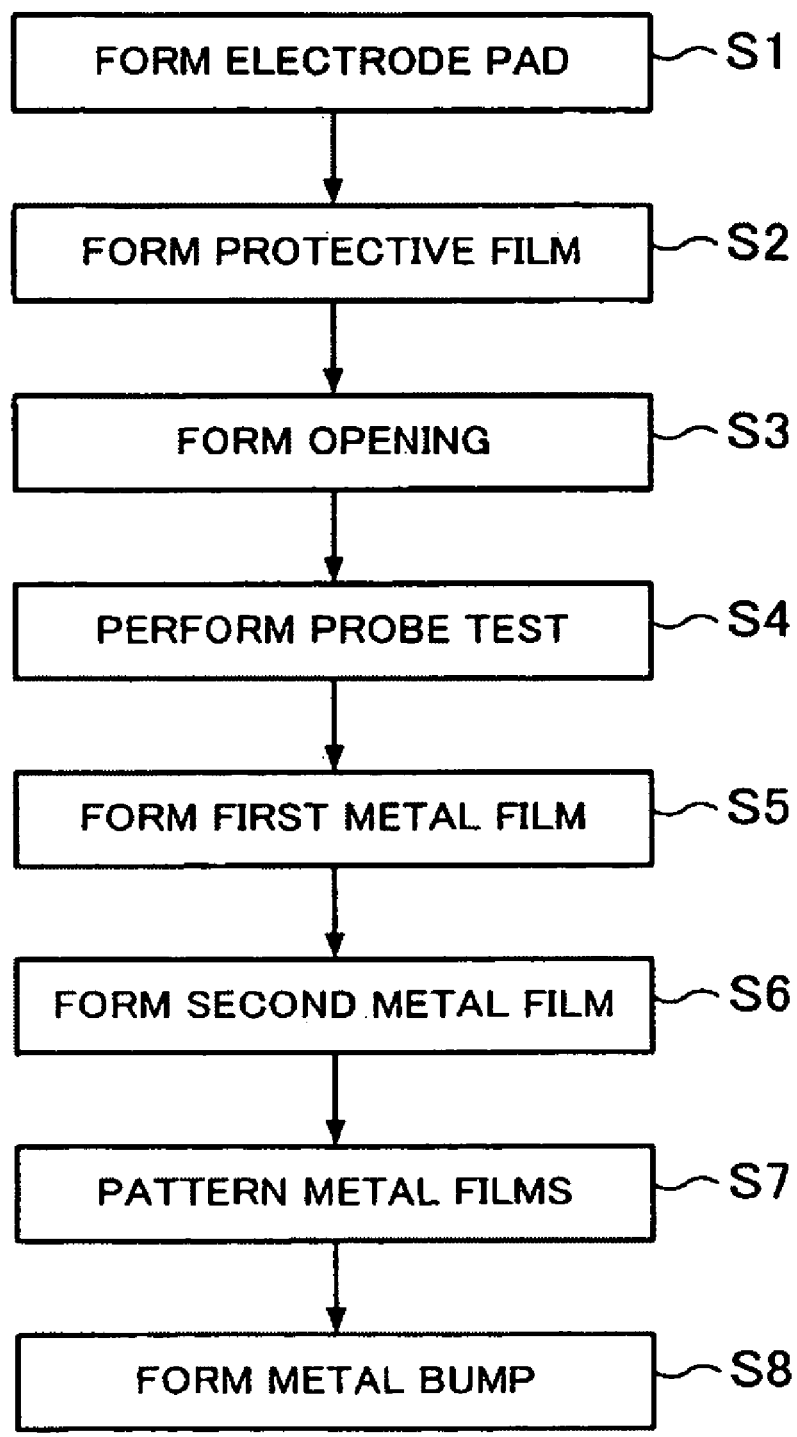
FIG. 2 shows a formation flow of a FeRAM element according to a first embodiment.

The FeRAM element formation flow according to the first embodiment is shown in FIG. 2.

In forming the metal film 9 over the electrode pad 6 of the FeRAM element 1, a predetermined fundamental structure of the FeRAM element 1 before the probe test is first formed.

More specifically, a so-called wafer process is applied as follows. An active element such as a transistor is formed over one main surface of the semiconductor substrate as well as a ferroelectric capacitor is formed in a multilayer wiring layer over the semiconductor substrate. Further, an electrode pad electrically connected to the transistor and the ferroelectric capacitor is formed on the multilayer wiring layer (step S1). Thereafter, a protective film for covering the semiconductor substrate surface containing the electrode pad is formed (step S2). Further, an opening which reaches the electrode pad is formed in the protective film (step S3).

These steps are simultaneously performed for each of a plurality of the semiconductor elements (FeRAM elements) formed on the semiconductor substrate.

In such a state, a desired test is performed by bringing a needle-shaped probe into contact with the electrode pad of the semiconductor element (step S4).

Due to contact with the probe, a mechanical injury is caused to the electrode pad. In the present embodiment, the first metal film 9a is formed over the whole surface including the electrode pad surface (step S5). Further, the second metal film 9b is formed over the film 9a (step S6).

Herein, the first and second metal films 9a and 9b are formed at a temperature from 150 to 220° C. using a sputtering technique. The reason is as follows. That is, when the film formation temperature is more than 220° C., there is a possibility that memory data written in the ferroelectric capacitor 4 is erased. On the other hand, when the film formation temperature is less than 150° C., there is a high possibility that not a dense film which is excellent in thickness uniformity but a porous film which is permeable to moisture is formed. When the film formation is performed in the temperature range from 150 to 220° C., memory data of the ferroelectric capacitor 4 can be maintained as well as the thickness uniformity and excellent film quality of the first and second metal films 9a and 9b can be secured.

Further, the first and second metal films 9a and 9b are formed to have the total film thickness of 200 nm or more. Therefore, for example, even when the concave portion 8a generated after the probe test has an inverted taper cross section, that is, even when the concave portion 8a has a hollowed shape as viewed from the electrode pad 6 side, such a portion can be covered with the first and second metal films 9a and 9b. Further, when the film formation temperature is set in the range from 150 to 220° C. as described above, the first and second metal films 9a and 9b with an excellent film quality are formed even over such an inverted taper cross sectional portion.

Further, even in the case where a step between the concave portion 8a and convex portion 8b of the electrode pad 6 is relatively large, for example, the step therebetween is 1 μm or more, when the first and second metal films 9a and 9b are formed to have the total film thickness of 200 nm or more, the electrode pad 6 can be effectively covered.

After formation of the first and second metal films 9a and 9b, the films 9a and 9b are selectively etched and patterned (step S7), thereby forming the metal film 9 for covering the electrode pad 6.

On this occasion, the metal film 9 is patterned as follows. That is, an end of the film 9 is extended on the protective film 7 to make a state where a length of a portion of the metal film 9 covering the protective film 7 is 1 m or more, preferably about 5 μm. When the length is less than 1 μm, an adhesion more than a fixed value cannot be secured between the first lower metal film 9a and the protective film 7, and as a result, the metal film 9 easily peels off.

Further, the upper limit in the length of the portion which covers the protective film 7 may be set in consideration of a size (a distance between the electrode pads 6) of the FeRAM 1 to be formed. When the length of the portion which covers the protective film 7 is set to 1 μm or more, the peeling of the metal film 9 for covering the electrode pad 6 is suppressed.

In the patterning by etching, side etching usually occurs at the pattern edge. Therefore, the metal film 9 is easily formed to have a size smaller than that of a transfer pattern (a resist pattern) of a mask. Further, when the etching is performed for a laminated film composed of the first and second metal films 9a and 9b, the side etching amount of the first lower metal film 9a tends to increase more than that of the second upper metal film 9b. Accordingly, in consideration of occurrence of such side etching, the patterning of the first and second metal films 9a and 9b is performed such that a length of the portion which covers the protective film 7 is 1 μm or more.

After the metal film 9 is thus formed, the metal bump 10 is formed on the film 9 (step S8).

The metal bump 10 can be formed to a so-called two step-shaped bump composed of, for example, a relatively large lower stage part having a roughly elliptical cross-section and an upper stage part provided projectingly on the lower stage part. The two step-shaped bump can be formed using the following method. That is, a metal wire is connected to the metal film 9 in a normal wire bonding manner and then, the metal wire is torn off. Alternatively, the metal wire is torn off and then, is further struck using a predetermined tool to make the upper stage part smaller.

At the stage of step S8, on the metal film 9, a metal wire may be connected in place of the metal bump 10. The metal wire can be formed using gold (Au), copper (Cu) and palladium (Pd).

Through the above-described manufacturing process flow, the FeRAM element 1 is formed.

As described above, in the first embodiment, the electrode pad 6 which is surfaced within the opening formed in the protective film 7 and is injured during a test using a probe, and the region from the electrode pad 6 to the opening outer periphery of the protective film 7 are covered with the metal film 9 and then, the metal bump 10 is formed on the film 9.

Therefore, even when the concave portion 8a and/or the convex portion 8b are formed in the electrode pad 6, or even when a gap is formed between the electrode pad 6 and the metal bump 10, penetration of moisture into the inside can be prevented by the metal film 9.

By thus improving moisture resistance, penetration of moisture into the ferroelectric capacitor 4 can be effectively prevented. Therefore, occurrence of the potential inversion abnormality is suppressed and as a result, the FeRAM element 1 having high reliability can be realized.

Next, a second embodiment will be described.

Figure 3:
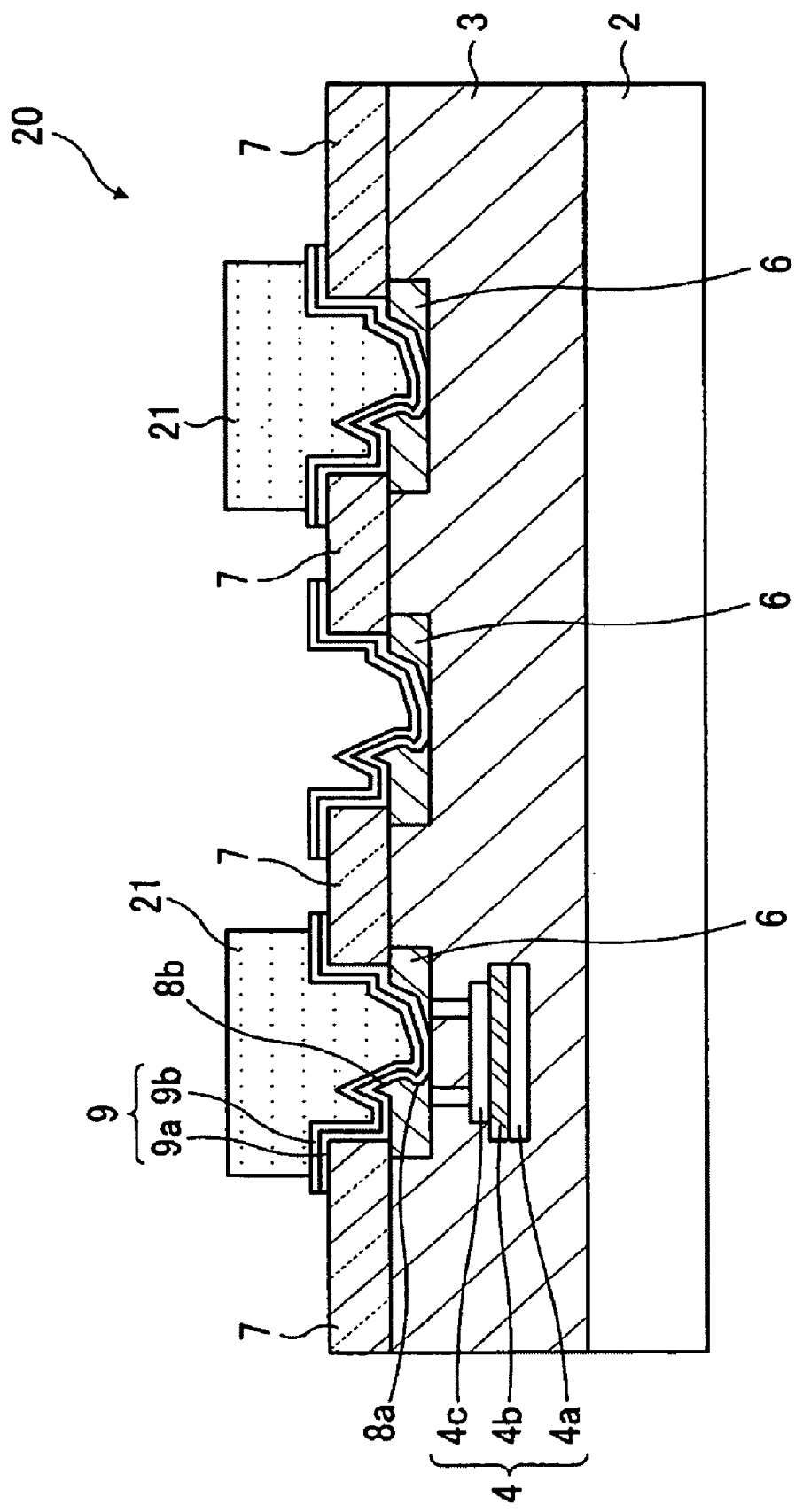
FIG. 3 is a schematic sectional view showing an essential part of a FeRAM element according to a second embodiment.

FIG. 3 is a schematic sectional view showing an essential part of a FeRAM element according to the second embodiment. In FIG. 3, the same elements as those shown in FIG. 1 are indicated by the same reference numerals as in FIG. 1 and the detailed description is omitted.

A FeRAM element 20 according to the second embodiment has the following structure. That is, the electrode pad 6 which is surfaced within the opening formed in the protective film 7 and is injured during a test using a probe, and the region from the electrode pad 6 to the opening outer periphery of the protective film 7 are covered with the metal film 9. Further, a metal bump 21 with a flat surface is formed over the film 9.

The FeRAM element 20 having such a structure is formed as follows. That is, after the probe test using the electrode pad 6, the metal film 9 composed of the first and second metal films 9a and 9b is formed over the electrode pad 6. Then, a film of materials for the metal bump 21 is formed to a predetermined film thickness on the whole surface. Then, the formed film is patterned to leave it on the predetermined metal film 9.

To the film formation of materials for the metal bump 21, a liquid phase epitaxial growth method such as an electroplating method, or a Physical Vapor Deposition (PVD) method such as a sputtering technique can be applied. Further, the metal bump 21 is formed such that an opening of the protective film 7 at a formation position of the bump 21 is perfectly covered with the metal bump 21.

By thus providing the metal bump 21 with a flat surface over the metal film 9, the electrode pad 6 and a periphery thereof can be perfectly covered with the metal film 9 and the metal bump 21. Therefore, even when the concave portion 8a and/or the convex portion 8b are formed in the electrode pad 6 after the probe test, penetration of moisture can be prevented. As a result, the FeRAM 20 having high moisture resistance and high reliability can be realized.

A planar shape of the metal bump 21 is not particularly limited. The bump 21 can be formed, for example, to have a circular shape or an oblong shape.

Figure 4:
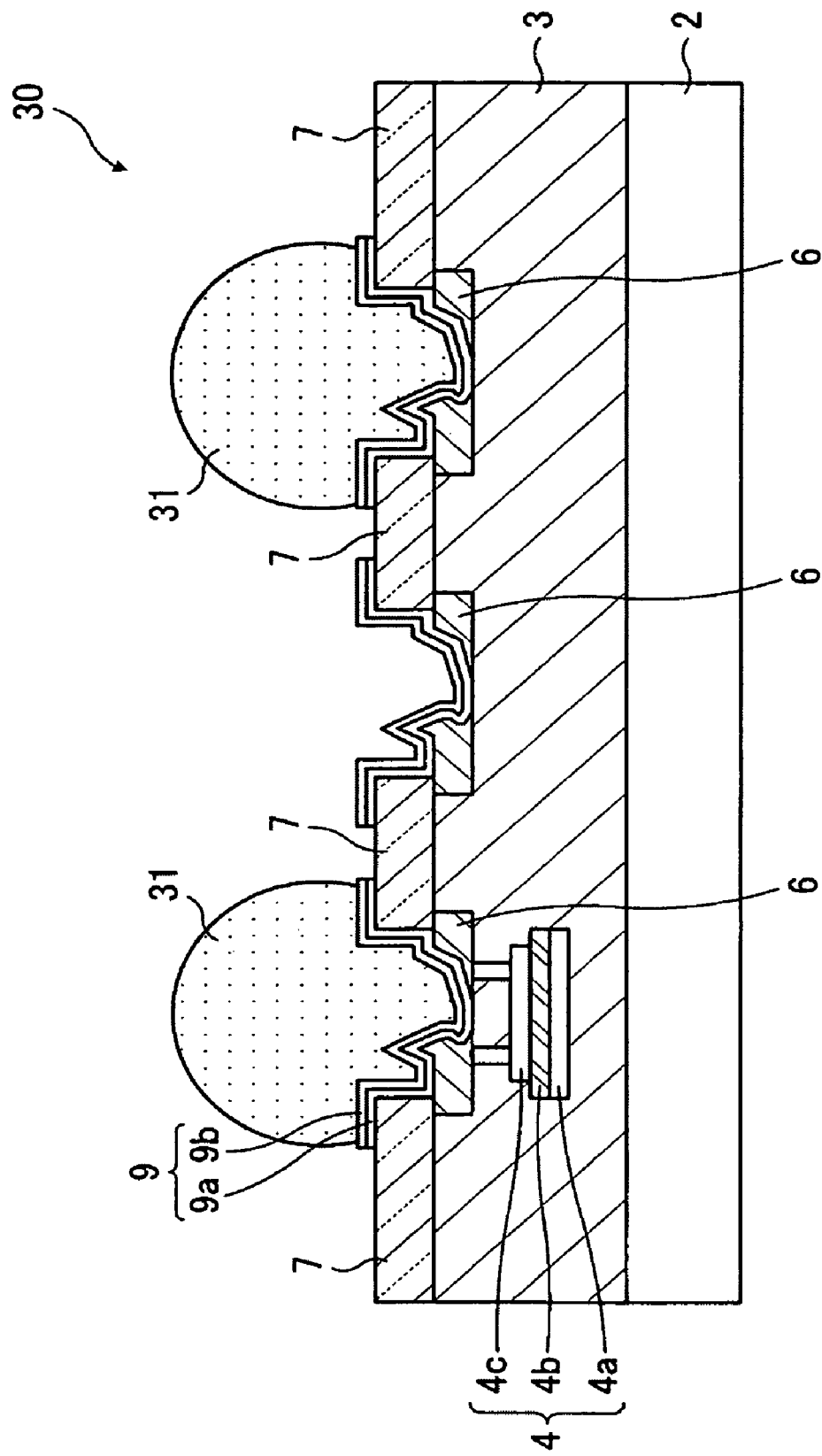
FIG. 4 is a schematic sectional view showing an essential part of a FeRAM element according to a third embodiment.

Next, a third embodiment will be described. FIG. 4 is a schematic sectional view showing an essential part of a FeRAM element according to the third embodiment. In FIG. 4, the same elements as those shown in FIG. 1 are indicated by the same reference numerals as in FIG. 1 and the detailed description is omitted.

A FeRAM element 30 according to the third embodiment has the following structure. That is, the electrode pad 6 which is surfaced within the opening formed in the protective film 7 and is injured during a test using a probe, and the region from the electrode pad 6 to the opening outer periphery of the protective film 7 are covered with the metal film 9. Further, a solder bump 31 is formed on the film 9.

The FeRAM element 30 is formed as follows. That is, after the probe test using the electrode pad 6, the metal film 9 composed of the first and second metal films 9a and 9b is formed over the electrode pad 6. Then, the solder bump 31 with an approximately semicircular cross section is formed on the metal film 9 using a plating method or a printing method.

For the solder bump 31, for example, an alloy mainly containing tin (Sn) as well as an alloy containing lead (Pb) or indium (In) can be used. The solder bump 31 is formed such that an opening of the protective film 7 at a formation position of the bump 31 is perfectly covered.

By thus covering the electrode pad 6 and a periphery thereof with the metal film 9 and the solder bump 31, penetration of moisture can be prevented. As a result, the FeRAM element 30 having high moisture resistance and high reliability can be realized.

Next, a fourth embodiment will be described.

Figure 5:
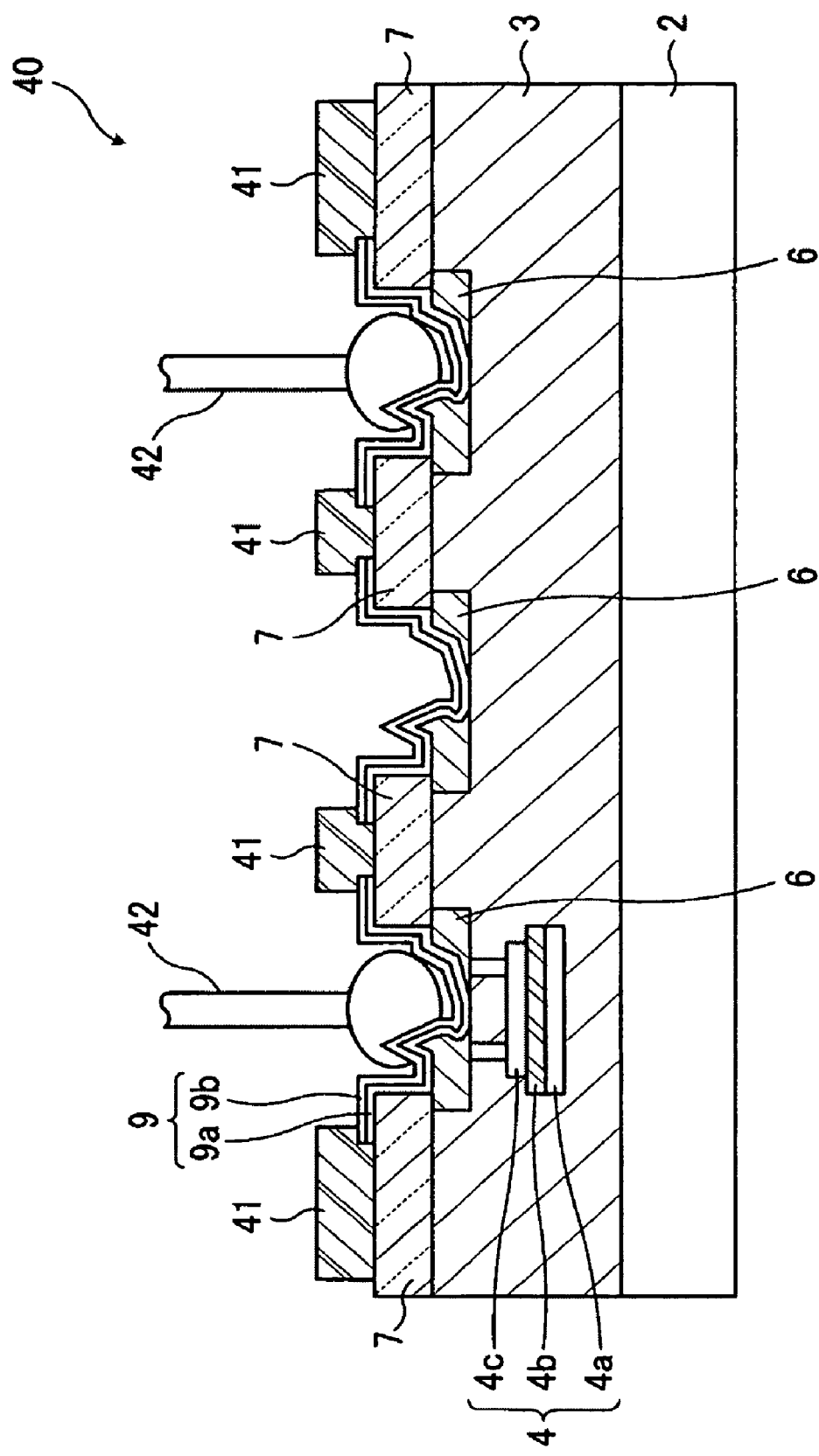
FIG. 5 is a schematic sectional view showing an essential part of a FeRAM element according to a fourth embodiment.

FIG. 5 is a schematic sectional view showing an essential part of a FeRAM element according to the fourth embodiment. In FIG. 5, the same elements as those shown in FIG. 1 are indicated by the same reference numerals as in FIG. 1 and the detailed description is omitted.

In a FeRAM element 40 according to the fourth embodiment, the electrode pad 6 which is surfaced within the opening formed in the protective film 7 and is injured during a test using a probe, and the region from the electrode pad 6 to the opening outer periphery of the protective film 7 are covered with the metal film 9. Further, both ends of the metal film 9 are covered with an insulating film 41.

Further, in the FeRAM element 40 according to the fourth embodiment, after the probe test using the electrode pad 6, the metal film 9 for covering the electrode pad 6 and the region from the electrode pad 6 to the opening outer periphery of the protective film 7 is formed over the pad 6. Further, on the metal film 9, a metal wire 42 formed using gold (Au), copper (Cu) and palladium (Pd) is connected in place of the metal bump 10 described in the first embodiment.

Thus, the insulating film 41 for covering the end of the metal film 9 serves as a peeling preventive film for preventing the metal film 9 from peeling from the protective film 7. It is preferred that in covering the end of the metal film 9, the insulating film 41 is formed to cover the end in the length from an edge of 1 μm or more. When the insulating film 41 covers the end of the metal film 9 in such a length, the peeling of the metal film 9 from the protective film 7 is effectively prevented.

For the insulating film 41, a material such as polyimide, an epoxy resin and a phenol resin can be used. The material mainly containing these resins can be cured at a temperature of 220° C. or less capable of keeping memory data in the ferroelectric capacitor 4. Further, the material has excellent adhesion to the protective film 7.

Accordingly, when the end of the metal film 9 is covered with the insulating film 41 using the resins, memory data in the ferroelectric capacitor 4 can be kept as well as peeling of the metal film 9 can be effectively prevented. Further, such an insulating film 41, when resin-sealing the FeRAM element 40, also plays a role in strengthening adhesion to a sealing resin.

On the metal film 9, the metal bumps 10 and 21, or solder bump 31 described in the first, second and third embodiments can also be formed in place of the metal wire 42. In such a case, the size (height) of the metal bump 10 and/or the film thickness of the insulating film 41 are appropriately adjusted to allow the metal bump 10 to partially project from the surface, that is, to allow the FeRAM element 40 to be mounted through the metal bump 10.

Next, a fifth embodiment will be described.

Figure 6:
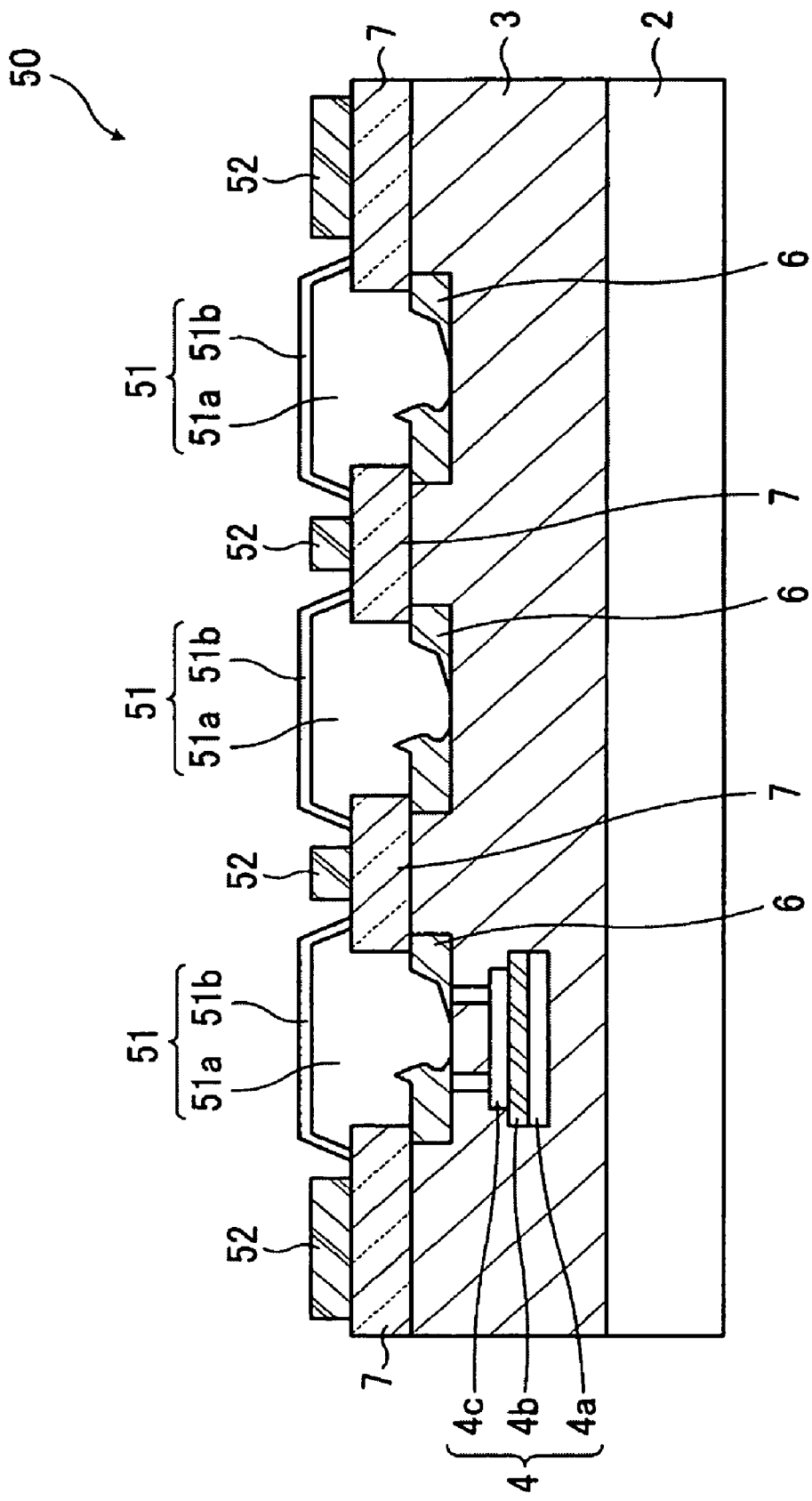
FIG. 6 is a schematic sectional view showing an essential part of a FeRAM element according to a fifth embodiment.

FIG. 6 is a schematic sectional view showing an essential part of a FeRAM element according to the fifth embodiment. In FIG. 6, the same elements as those shown in FIG. 1 are indicated by the same reference numerals as in FIG. 1 and the detailed description is omitted.

In a FeRAM element 50 according to the fifth embodiment, the electrode pad 6 and the region from the electrode pad 6 to the opening outer periphery of the protective film 7 are covered with the metal bump 51 having a two-layer structure in place of being covered with the metal film 9.

Further, in the FeRAM element 50 according to the fifth embodiment, an insulating film 52 made of polyimide is provided over a surface of the insulating layer 7 other than a formation region of the metal bump 51 in order to strengthen adhesion to the sealing resin.

The metal bump 51 in the fifth embodiment is formed as follows. That is, after the probe test using the electrode pad 6, a nickel (Ni) layer 51a is first formed by an electroless plating method. Next, a gold (Au) layer 51b is formed over the nickel (Ni) layer 51a by the electroless plating method.

The surface of the metal bump 51 has an almost flat one.

At this time, a zincate treatment as a pretreatment is performed to uniformly deposit zinc (Zn) onto a portion where a plating solution comes in contact with the electrode pad 6 made of aluminum (Al). Thereafter, a metal such as nickel (Ni) is grown by the electroless plating method. Thus, the metal bump 51 having excellent film quality can be formed.

In forming the metal bump 51 on the electrode pad 6 and on the region from the pad 6 to the opening outer periphery of the protective film 7 using the electroless plating method, a film thickness (a film thickness of the portion which extends on the protective film 7) of the metal bump 51 is preferably set in a range of 1 to 12 μm. Depending on the structure of the FeRAM element 50, when the film thickness of the metal bump 51 is less than 1 μm, the metal bump 51 is not allowed to project from the surface of the FeRAM element 50, or mounting of the FeRAM element 50 becomes difficult due to the small amount of projection.

When these problems do not occur, the metal bump 51 may be formed to a film thickness less than 1 μm. Further, the reason why the film thickness of the metal bump 51 is set to 12 μm or less is as follows. That is, when the film thickness of the metal bump 51 is more than 12 μm, an influence of stress generated during a growth process of a metal film by the electroless plating method increases, and as a result, there may easily occur a problem that the metal film is peeled during the growth process or after the growth.

By thus perfectly covering the electrode pad 6 and the periphery thereof with the metal bump 51, penetration of moisture can be effectively prevented.

Next, a sixth embodiment will be described.

Figure 7:
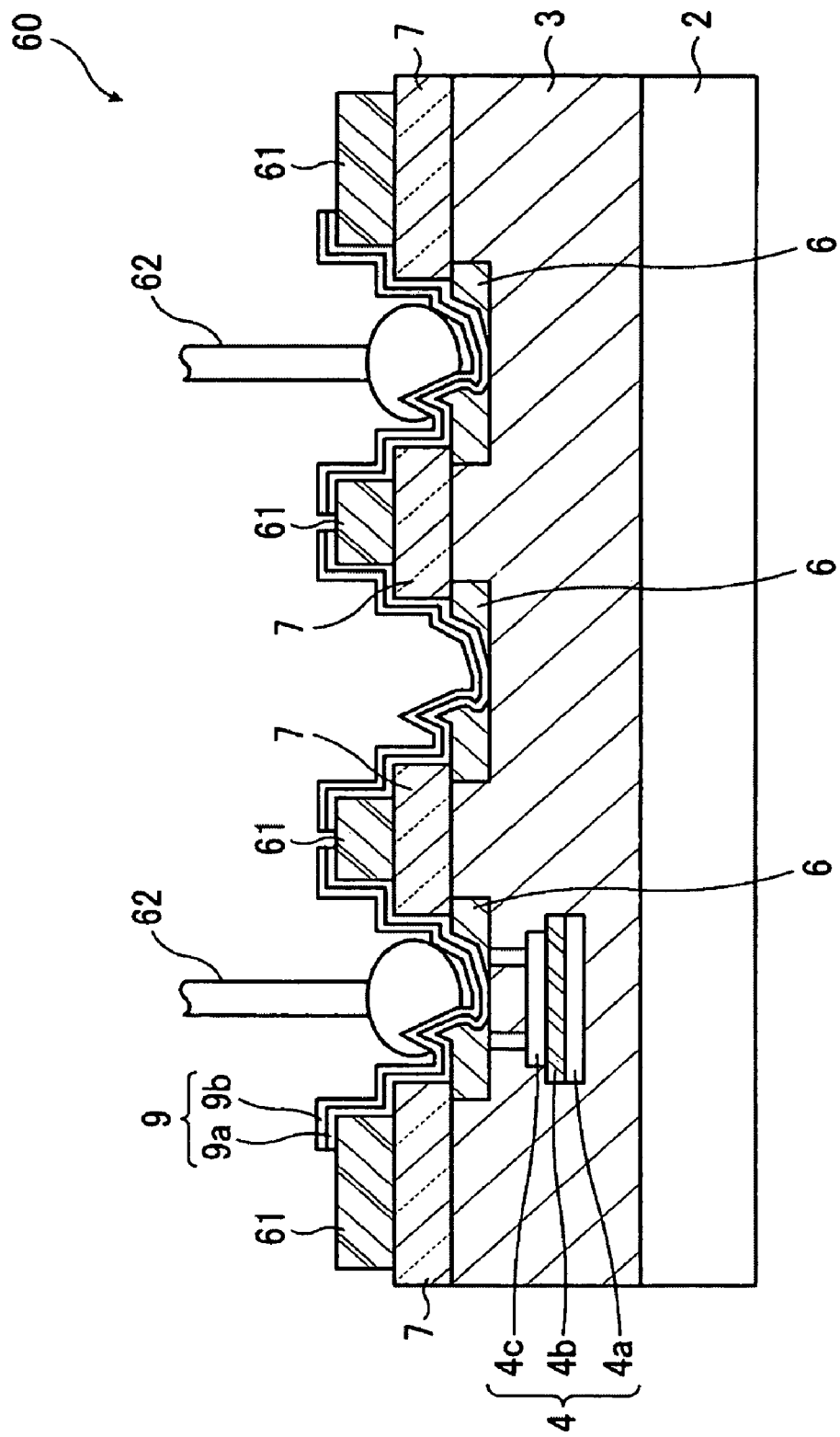
FIG. 7 is a schematic sectional view showing an essential part of a FeRAM element according to a sixth embodiment.

FIG. 7 is a schematic sectional view showing an essential part of a FeRAM element according to the sixth embodiment. In FIG. 7, the same elements as those shown in FIG. 1 are indicated by the same reference numerals as in FIG. 1 and the detailed description is omitted.

In a FeRAM element 60 according to the sixth embodiment, an organic insulating film 61 is provided over the protective film 7 excluding an opening where the electrode pad 6 is surfaced as well as excluding the outer periphery thereof. Further, after the probe test using the electrode pad 6, the metal film 9 is formed, extending from the electrode pad 6 through the protective film 7 to the insulating film 61.

Further, in the FeRAM element 60 according to the sixth embodiment, the metal wire 62 formed using gold (Au), copper (Cu) and palladium (Pd) is connected on the metal film 9.

For the insulating film 61, there is used a material which can be cured at a temperature of 220° C. or less capable of keeping memory data in the ferroelectric capacitor 4, for example, an organic material mainly containing polyimide, an epoxy resin or a phenol resin.

As described above, respective materials of the first and second metal films 9a and 9b of the metal film 9 are selected in consideration of adhesion to the protective film 7 and the metal wire 62. Herein, titanium (Ti) or chromium (Cr) which can be used for the first metal film 9a has a tendency to show strong adhesion to the organic insulating film 61 made of polyimide as compared with the adhesion to the protective film 7 made of inorganic materials such as silicon nitride (SiN).

Accordingly, by employing a structure that in response to the material of the first metal film 9a, the metal film 9 extends up to the insulating film 61 as shown in FIG. 7, the insulating film 61 serves as a peeling preventive film of the metal film 9 and as a result, the peeling of the metal film 9 can be prevented. Further, the insulating film 61, when sealing the FeRAM element 60, also plays a role in strengthening adhesion to the sealing resin.

It is preferred that in allowing the metal film 9 to extend up to the end of the insulating film 61 and allowing it to ride over the film 61 to cover the end of the film 61, the metal film 9 is formed to cover the end of the insulating film 61 from its edge of 1 μm or more in the width. As a result, the peeling of the metal film 9 from the insulating film 61 can be effectively prevented.

In forming such a FeRAM element 60, the electrode pad 6 and the protective film 7 are formed and then, an opening which reaches the electrode pad 6 is formed in the protective film 7. Then, the organic insulating film 61 is first formed over the whole surface and patterned into a predetermined shape.

Thereafter, the first and second metal films 9a and 9b are formed over the whole surface and patterned into a predetermined shape, thereby forming the metal film 9 having a pattern shown in FIG. 7.

Further, on the metal film 9, the metal bumps 10 and 21, or solder bump 31 described in the first, second and third embodiments may be formed in place of the metal wire 62. In such a case, the size (height) of the metal bump 10 and/or the film thickness of the insulating film 61 and the metal film 9 must be appropriately adjusted to allow the metal bump 10 to partially project from the sealing resin.

As described above, the first to sixth embodiments are described. The metal film 9 or the metal bump 51 can be applied also to a case in which the concave portion 8a and the convex portion 8b are not formed in the electrode pad 6 as well as to a case in which a gap 11 is absent between the electrode pad 6 and the protective film 7.

There will be exemplified below a packaging structure where a FeRAM element having the above-described structure is housed.

One of the packaging structures will be described as a seventh embodiment.

Figure 8:
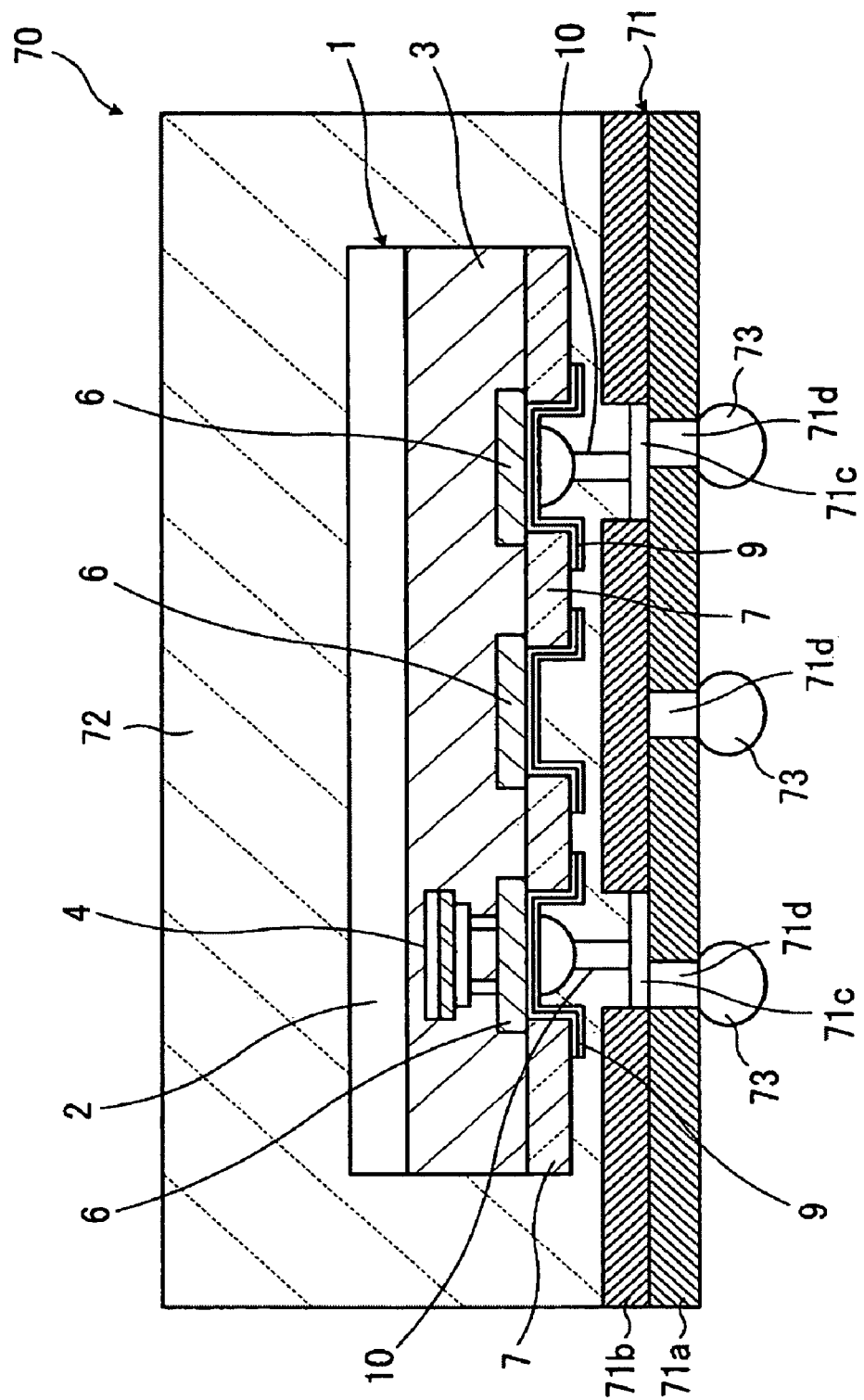
FIG. 8 is a schematic sectional view showing an essential part of a packaging structure according to a seventh embodiment.

FIG. 8 is a schematic sectional view showing an essential part of the packaging structure according to the seventh embodiment. In FIG. 8, the same elements as those shown in the embodiments are indicated by the same reference numerals as in the embodiments and the detailed description is omitted. Further, in FIG. 8, the irregularity formed in the electrode pad 6 is not shown.

A packaging structure 70 according to the seventh embodiment has the following structure. That is, the FeRAM element 1 according to the first embodiment is mounted on an interposer (also referred to as a support substrate or a wiring substrate) 71 by a flip chip (face down) method. Further, these are sealed with a sealing resin 72 such as an epoxy resin.

The interposer 71 has a structure that on the surfaces of and/or in the insides of insulating substrates 71a and 71b such as a glass epoxy substrate, wiring (not shown), an electrode pad 71c and a connection via 71d are formed.

The electrode pad 71c is formed at a position corresponding to the metal bump 10 of the FeRAM element 1. Further, the connection via 71d is formed such that one end thereof is connected to the electrode pad 71c directly or through wirings and the other end thereof is exposed to an opposite surface side of the pad 71c formation surface side in the insulating substrate.

Further, on the other end of the connection via 71d, a solder ball 73 is provided as an external connection terminal of the packaging structure 70.

When using such a packaging structure 70 according to the seventh embodiment, there can be realized a high-performance semiconductor device including the FeRAM element 1 with high moisture resistance and high reliability, in which the potential inversion abnormality is effectively suppressed.

Herein, there is exemplified a case where the FeRAM element 1 according to the first embodiment is mounted on the interposer 71. Further, the FeRAM elements 20, 30 and 50 according to the second, third and fifth embodiments can be similarly mounted to form the same packaging structure.

Further, the FeRAM element 40 according to the fourth embodiment can be similarly mounted by changing the metal wire 42 to the metal bump 10 to form the same packaging structure.

Next, another packaging structure will be described as an eighth embodiment.

Figure 9:
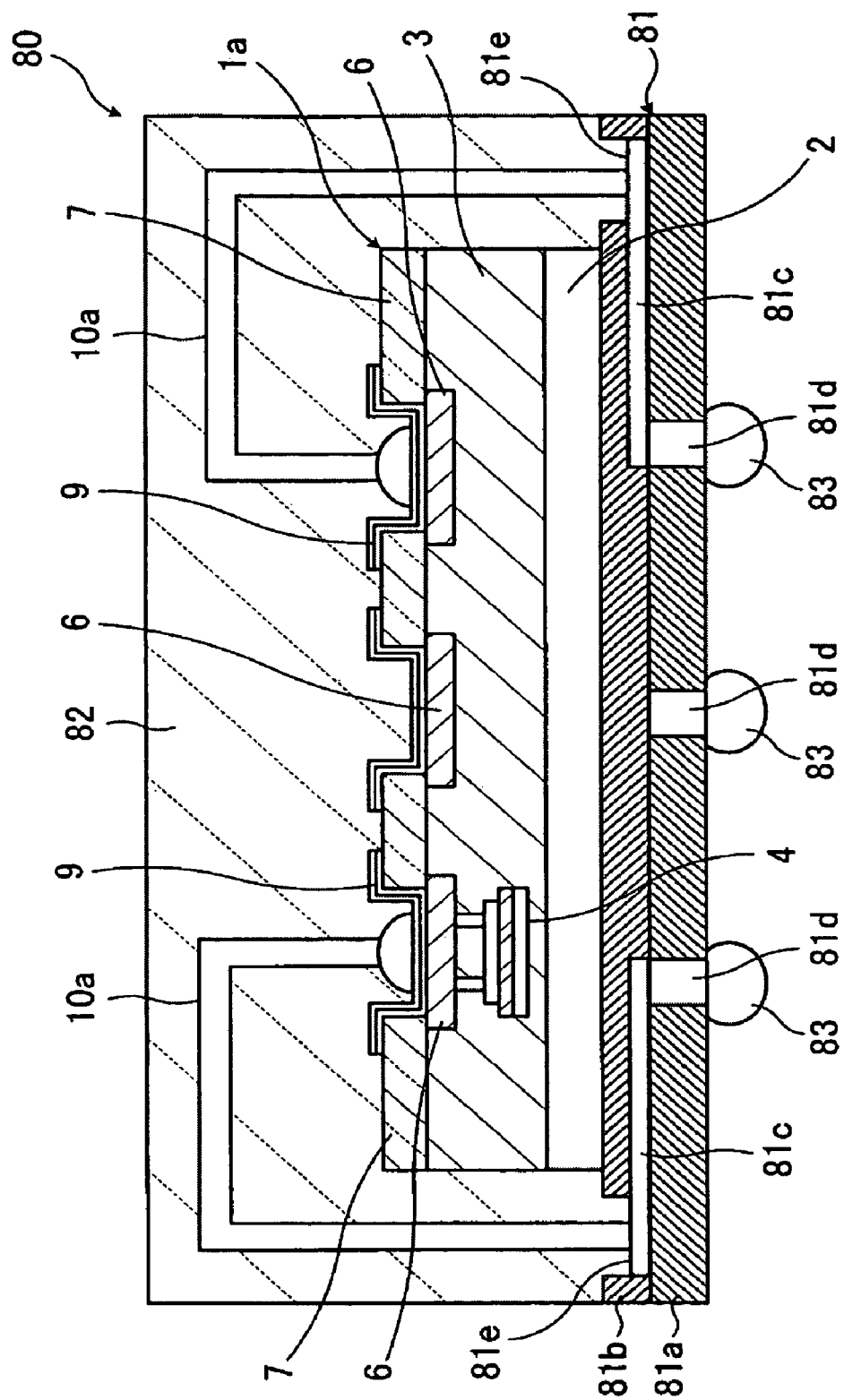
FIG. 9 is a schematic sectional view showing an essential part of a packaging structure according to an eighth embodiment.

FIG. 9 is a schematic sectional view showing an essential part of the packaging structure according to the eighth embodiment. In FIG. 9, the same elements as those shown in FIG. 1 are indicated by the same reference numerals as in FIG. 1 and the detailed description is omitted. Further, in FIG. 9, the irregularity formed in the electrode pad 6 shown in FIG. 1 is not shown.

A packaging structure 80 according to the eighth embodiment has the following structure. That is, by changing the metal bump 10 according to the first embodiment to a metal wire 10*a*, a FeRAM element 1*a* is mounted on an interposer 81 by a normal face up method. Further, connection between an electrode pad section of the element 1*a* and an electrode pad on the interposer 81 is performed through wire bonding. Further, these are sealed with a sealing resin 82 such as an epoxy resin.

The interposer 81 has a structure that on the surfaces of and/or in the insides of insulating substrates 81*a* and 81*b* such as a glass epoxy substrate, a wiring 81*c* formed between the substrates 81*a* and 81*b* as well as a connection via 81*d* of which one end is connected to the wiring 81*c* is formed. On the other end of the connection via 81*d*, a solder ball 83 is formed as an external connection terminal of the packaging structure 80.

The packaging structure 80 according to the eighth embodiment is constituted as follows. That is, connection between the electrode pad 6 of the FeRAM element 1*a* mounted on the interposer 81 and an electrode pad 81*e* on the interposer 81 is performed through the metal wire 10*a*. Then, these are sealed with the sealing resin 82.

When using such a packaging structure 80, there can be formed a high-performance semiconductor device including the FeRAM element 1*a* with high moisture resistance and high reliability, in which the potential inversion abnormality is effectively suppressed.

Herein, there is exemplified a case where the FeRAM element 1*a* is mounted on the interposer 81 by changing the metal bump 10 in the FeRAM element 1 shown in the first embodiment into the metal wire 10*a*. Further, the FeRAM element 40 according to the fourth embodiment can be similarly mounted to form the same packaging structure.

Next, another packaging structure will be described as a ninth embodiment.

Figure 10:
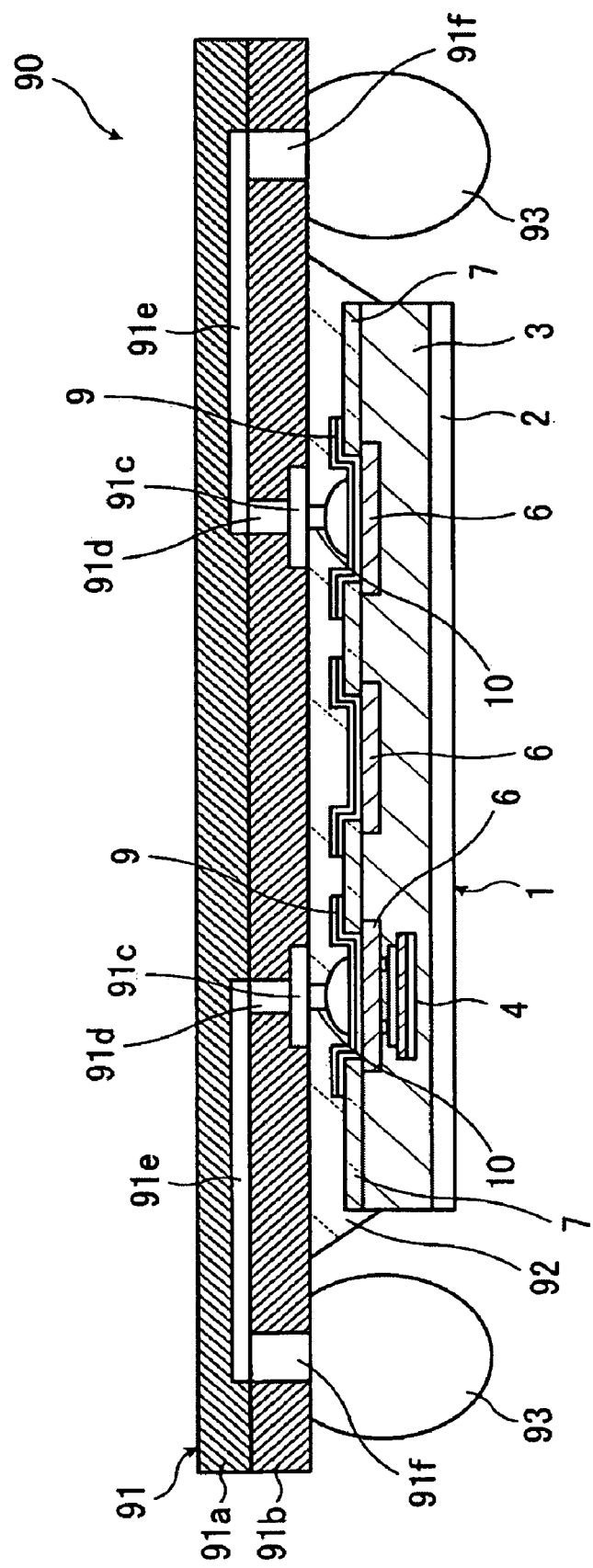
FIG. 10 is a schematic sectional view showing an essential part of a packaging structure according to a ninth embodiment.

FIG. 10 is a schematic sectional view showing an essential part of the packaging structure according to the ninth embodiment.

In FIG. 10, the same elements as those shown in FIG. 1 are indicated by the same reference numerals as in FIG. 1 and the detailed description is omitted. Further, the irregularity formed in the electrode pad 6 shown in FIG. 1 is not shown.

A packaging structure 90 according to the ninth embodiment has the following structure. That is, the FeRAM element 1 according to the first embodiment is mounted, for example, on the interposer 91 by the bump junction. Further, an underfill material 92 such as an epoxy resin is used to fill therebetween.

The interposer 91 has a structure that on the surfaces of and/or in the insides of insulating substrates 91*a* and 91*b* such as a glass epoxy substrate, an electrode pad 91*c* connected to the metal bump 10 of the FeRAM element 1, a first connection via 91*d* of which one end is connected to the pad 91*c*, a wiring 91*e* and a second connection via 91*f* connected to the via 91*d* through the wiring 91*e* are formed.

The other end of the second connection via 91*f* is exposed to the mounting surface side of the FeRAM element 1. On the other end of the via 91*f*, a solder ball 93 is provided as an external connection terminal.

When using such a packaging structure 90, there can be realized a high-performance semiconductor device including the FeRAM element 1 with high moisture resistance and high reliability, in which the potential inversion abnormality is effectively suppressed.

Herein, there is exemplified a case where the FeRAM element 1 according to the first embodiment is mounted on the interposer 91. Further, the FeRAM elements 20, 30 and 50 according to the second, third and fifth embodiments can be similarly mounted to form the same packaging structure.

Further, the FeRAM elements 40 and 60 according to the fourth and sixth embodiments can be similarly mounted by changing the metal wires 42 and 62 into the metal bump 10 to form the same packaging structure.

Next, another packaging structure will be described as a tenth embodiment.

Figure 11:
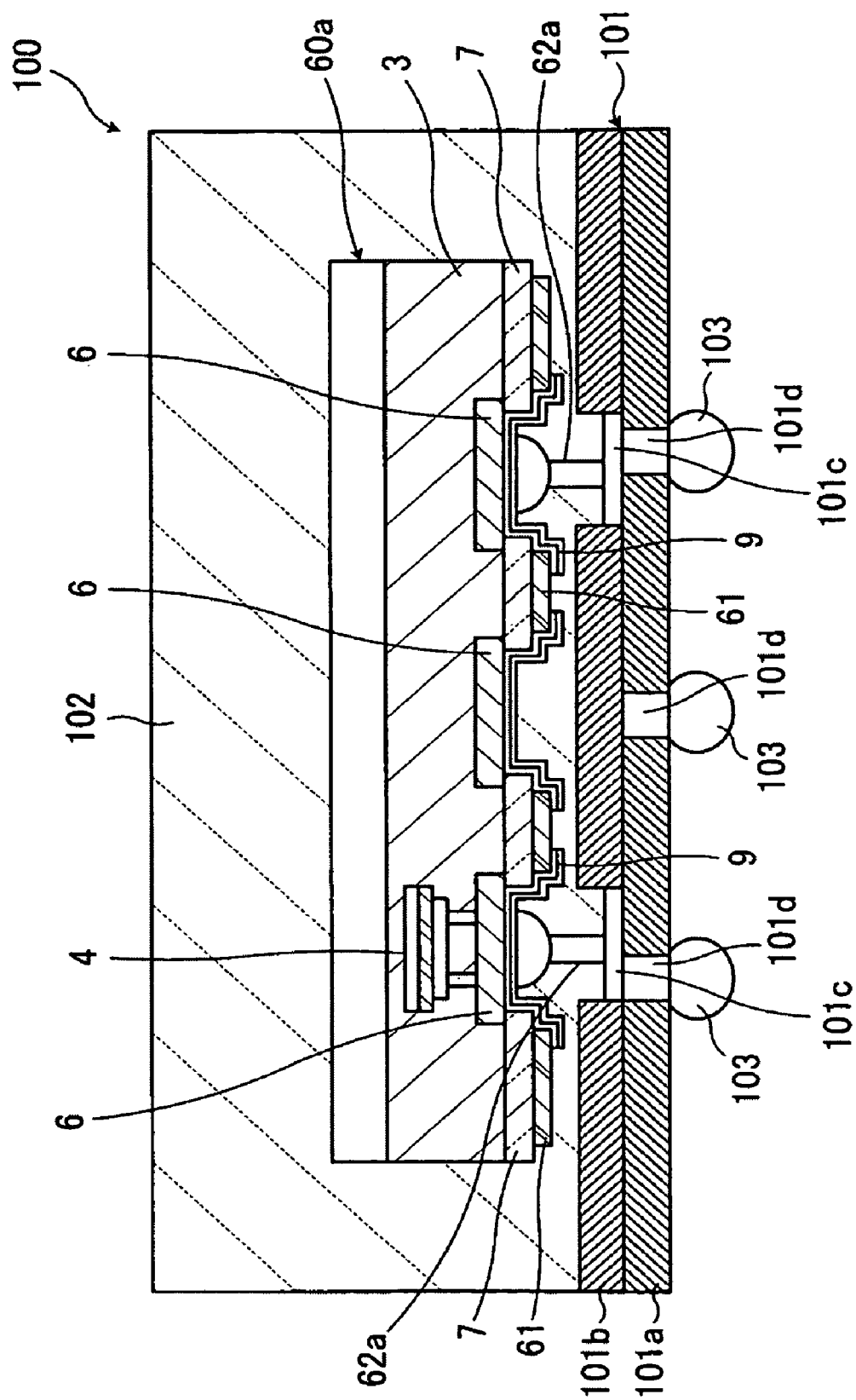
FIG. 11 is a schematic sectional view showing an essential part of a packaging structure according to a tenth embodiment.

FIG. 11 is a schematic sectional view showing an essential part of the packaging structure according to the tenth embodiment. In FIG. 11, the same elements as those shown in FIGS. 1 and 7 are indicated by the same reference numerals as in FIGS. 1 and 7 and the detailed description is omitted. Further, the irregularity formed in the electrode pad 6 shown in FIG. 7 is not shown.

A packaging structure 100 according to the tenth embodiment has the following structure. That is, by changing the metal wire 62 according to the sixth embodiment to a metal bump 62*a*, a FeRAM element 60*a* is mounted on an interposer 101 by the bump junction. Further, these are sealed with a sealing resin 102 such as an epoxy resin.

The interposer 101 has a structure that on the surfaces of and/or in the insides of insulating substrates 101*a* and 101*b* such as a glass epoxy substrate, an electrode pad 101*c* and a connection via 101*d* are formed. The electrode pad 101*c* is formed at a position corresponding to the metal bump 62*a* of the FeRAM element 60*a*. Further, one end of the connection via 71*d* is connected to the electrode pad 10*c*. Further, on the other end of the connection via 101*d*, a solder ball 103 is provided as an external connection terminal.

When using such a packaging structure 100, there can be realized a high-performance semiconductor device including the FeRAM element 60*a* with high moisture resistance and high reliability, in which the potential inversion abnormality is effectively suppressed.

Next, another packaging structure will be described as an eleventh embodiment.

Figure 12:
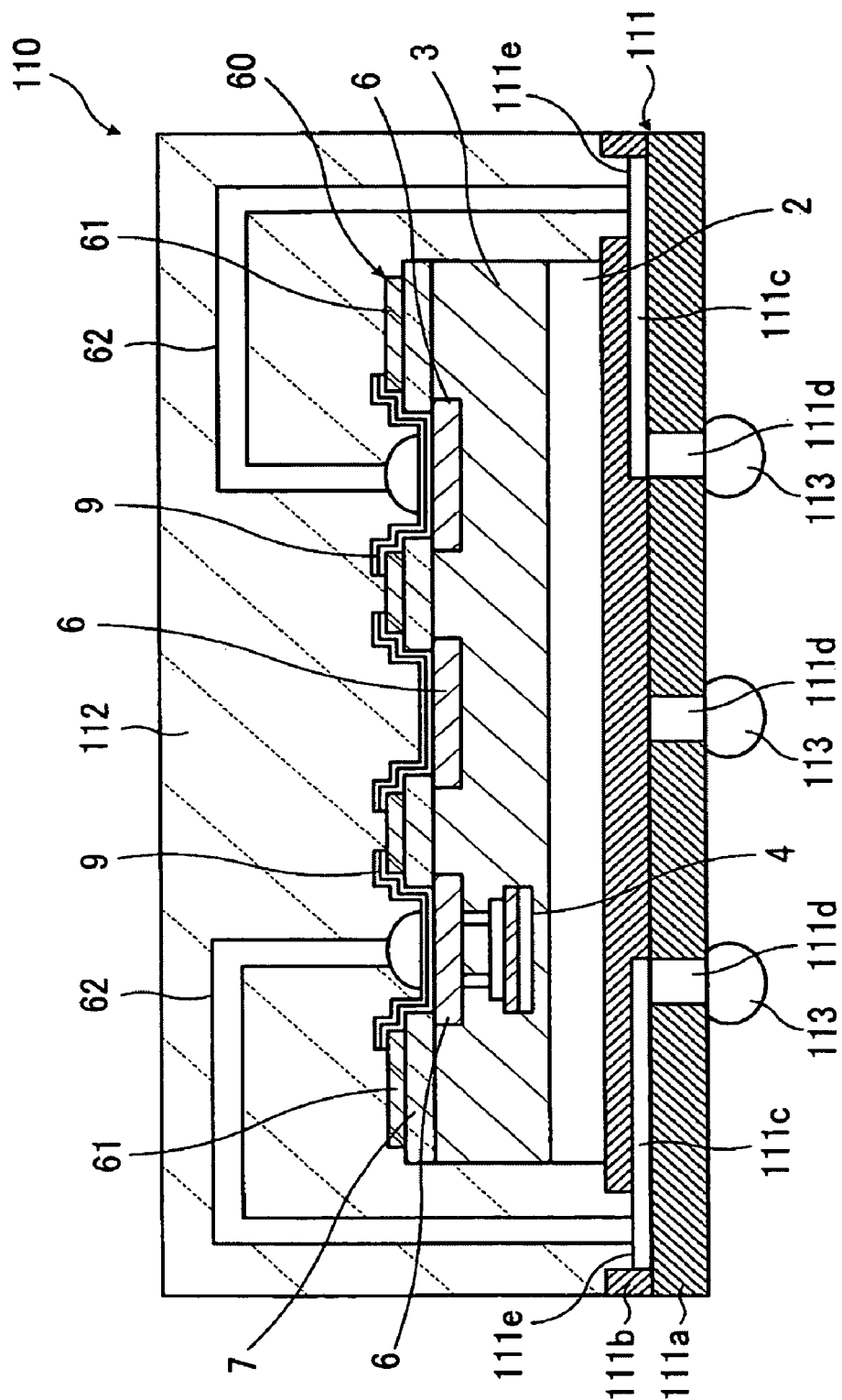
FIG. 12 is a schematic sectional view showing an essential part of a packaging structure according to an eleventh embodiment.

FIG. 12 is a schematic sectional view showing an essential part of the packaging structure according to the eleventh embodiment. In FIG. 12, the same elements as those shown in FIGS. 1 and 7 are indicated by the same reference numerals as in FIGS. 1 and 7 and the detailed description is omitted. Further, the irregularity formed in the electrode pad 6 shown in FIG. 7 is not shown.

A packaging structure 110 according to the eleventh embodiment has the following structure. That is, the FeRAM element 60 according to the sixth embodiment is mounted, for example, on an interposer 111 through the wire bonding. Further, these are sealed with a sealing resin 112 such as an epoxy resin.

The interposer 111 has a structure that on the surfaces of and/or in the insides of insulating substrates 111*a* and 111*b* such as a glass epoxy substrate, a wiring 111*c* formed between the substrates 111a and 111b as well as a connection via 111d of which one end is connected to the wiring 111c are formed. On the other end of the connection via 111d, a solder ball 113 is formed as an external connection terminal.

The packaging structure 110 according to the eleventh embodiment is constituted as follows. That is, connection between the electrode pad 6 of the FeRAM element 60 mounted on the interposer 111 and an electrode pad 111e on the interposer 111 having the wiring 111c partially exposed from the substrate 111a is performed through the metal wire 62. Then, these are sealed with the sealing resin 112.

When using such a packaging structure 110, there can be realized a high-performance semiconductor device including the FeRAM element 60 with high moisture resistance and high reliability, in which the potential inversion abnormality is effectively suppressed.

Next, another packaging structure will be further described as a twelfth embodiment.

Figure 13:
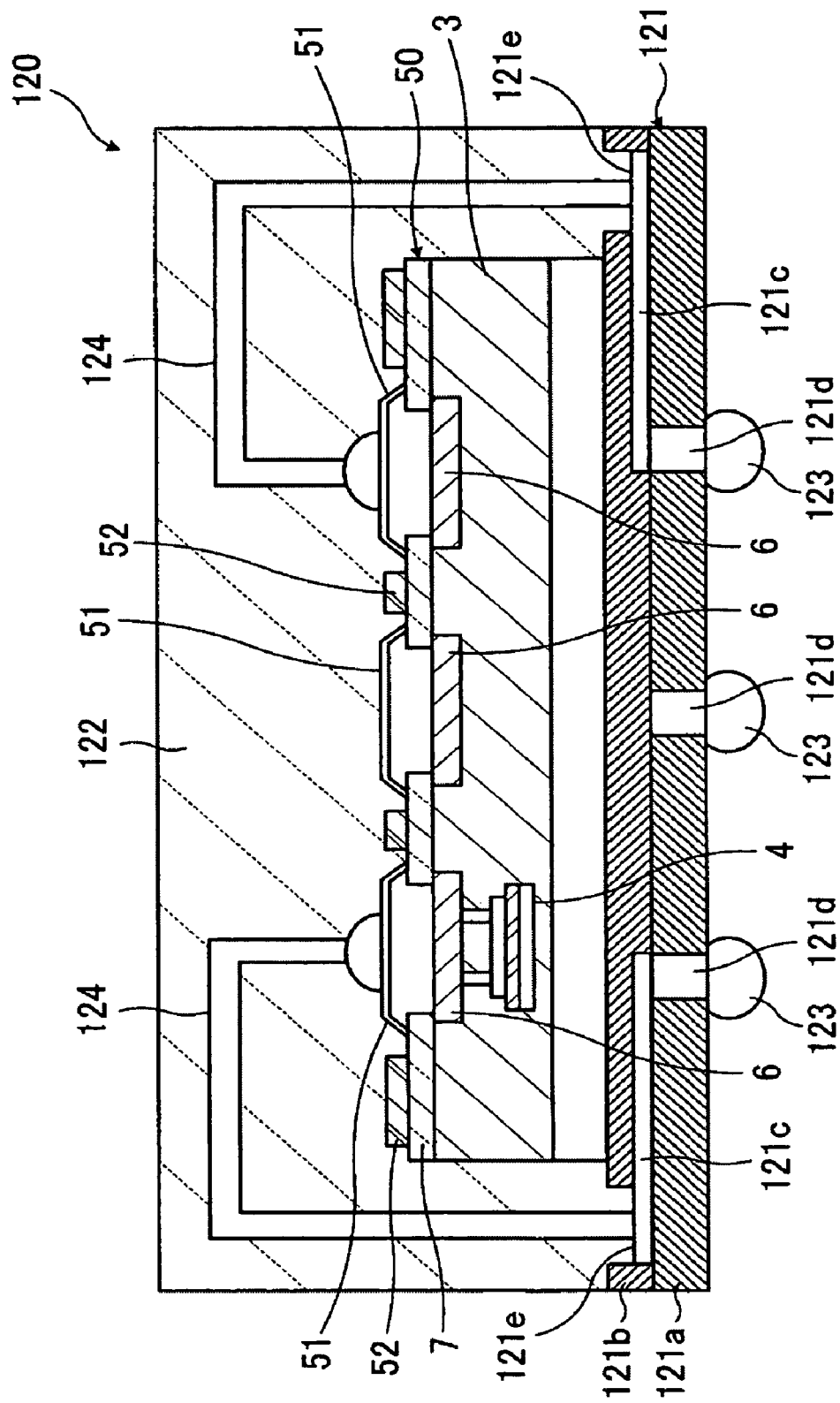
FIG. 13 is a schematic sectional view showing an essential part of a packaging structure according to a twelfth embodiment.
Figure 14:
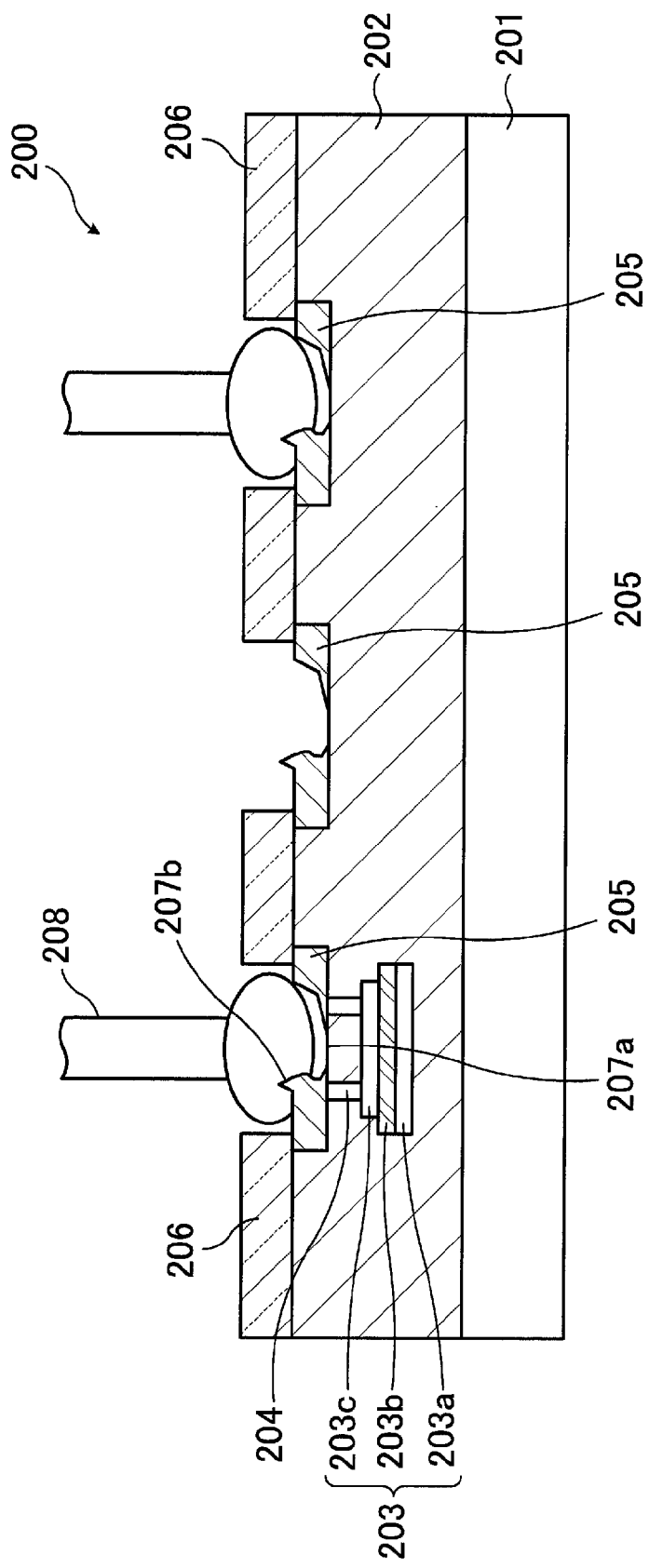
FIG. 14 schematically shows a state where in a FeRAM element, a metal wire is connected to an electrode pad after a probe test.

FIG. 13 is a schematic sectional view showing an essential part of the packaging structure according to the twelfth embodiment.

In FIG. 13, the same elements as those shown in FIGS. 1 and 6 are indicated by the same reference numerals as in FIGS. 1 and 6, and the detailed description is omitted. Further, the irregularity formed in the electrode pad 6 shown in FIG. 6 is not shown.

A packaging structure 120 according to the twelfth embodiment has the following structure. That is, the FeRAM element 50 according to the fifth embodiment is mounted, for example, on an interposer 121 by the wire bonding. Further, these are sealed with a sealing resin 122 such as an epoxy resin.

The interposer 121 has a structure that on the surfaces of and/or in the insides of insulating substrates 121a and 121b such as a glass epoxy substrate, a wiring 121c formed between the substrates 121a and 121b as well as a connection via 121d of which one end is connected to the wiring 121c is formed. On the other end of the connection via 121d, a solder ball 123 is formed as an external connection terminal.

The packaging structure 120 according to the eleventh embodiment is constituted as follows. That is, connection between the metal bump 51 of the FeRAM element 50 mounted on the interposer 121 and an electrode pad 121e on the interposer 121 having the wiring 121c partially exposed from the substrate 121a is performed through the metal wire 124. Further, these are sealed with the sealing resin 122.

When using such a packaging structure 120, there can be realized a high-performance semiconductor device including the FeRAM element 50 with high moisture resistance and high reliability, in which the potential inversion abnormality is effectively suppressed.

As described above, in the present embodiment, the electrode pad of the FeRAM element and the region from the electrode pad to an opening outer periphery of the protective film is covered with a conductive film such as a metal film.

Therefore, in performing a probe test using the electrode pad, even if the electrode pad is injured, penetration of moisture from the injured portion can be prevented since the electrode pad is covered with the conductive film. As a result, a semiconductor device having high moisture resistance and high reliability is realized.

Further, in mounting the semiconductor element on an external substrate such as an interposer, a metal bump or a metal wire is connected to an electrode pad through the conductive film. As a result, a semiconductor device having high moisture resistance and high reliability is realized.

In the above description, a FeRAM element and a semiconductor device having mounted thereon the FeRAM element are described as examples. Further, the above-described structure and formation method thereof can be similarly applied to a variety of semiconductor devices having an electrode pad.

In the present invention, an electrode pad having a mechanical injury is covered with a conductive film. Therefore, penetration of moisture from the electrode pad is prevented as well as occurrence of abnormality due to moisture after the penetration is effectively suppressed. As a result, there can be realized a semiconductor device having high moisture resistance and high reliability.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A manufacturing method of a semiconductor device, comprising:
    forming an electrode pad over a semiconductor substrate;
    bringing a probe into contact with the electrode pad;
    forming a conductive film to cover the electrode pad; and
    connecting an external connection terminal to the conductive film; wherein,
    in the forming of the conductive film, the conductive film is extended and formed over an insulating layer around the electrode pad.

2. The manufacturing method according to claim 1, wherein, in the forming of the conductive film, the conductive film is formed by a plurality of layers.

3. The manufacturing method according to claim 1, wherein, in the forming of the conductive film, the conductive film is formed to cover the insulating layer in the length of at least 1 μm.

4. The manufacturing method according to claim 1, further comprising forming, astride the insulating layer around the electrode pad and the end of the conductive film, a peeling preventive film for suppressing peeling of the end of the conductive film.

5. The manufacturing method according to claim 1, further comprising connecting a bump or a wire on the conductive film.

6. The manufacturing method according to claim 1, wherein, in the forming of the conductive film, a bump is formed as the conductive film.

* * * * *